United States Patent
Oh et al.

(10) Patent No.: US 10,263,203 B2
(45) Date of Patent: Apr. 16, 2019

(54) DISPLAY DEVICE

(71) Applicant: LG Display Co., Ltd., Seoul (KR)

(72) Inventors: Yeonjun Oh, Gimpo-si (KR);
Jonghyun Park, Goyang-si (KR);
Jaekyung Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/838,190

(22) Filed: Dec. 11, 2017

(65) Prior Publication Data
US 2018/0190917 A1 Jul. 5, 2018

(30) Foreign Application Priority Data
Dec. 30, 2016 (KR) .................. 10-2016-0184024

(51) Int. Cl.
| | |
|---|---|
| *H01L 29/08* | (2006.01) |
| *H01L 51/00* | (2006.01) |
| *H01L 51/56* | (2006.01) |
| *B32B 7/06* | (2019.01) |
| *H01L 27/32* | (2006.01) |

(52) U.S. Cl.
CPC ............ *H01L 51/0097* (2013.01); *B32B 7/06* (2013.01); *H01L 51/003* (2013.01); *H01L 51/0034* (2013.01); *H01L 51/56* (2013.01); *H01L 27/3244* (2013.01); *H01L 2227/323* (2013.01); *H01L 2227/326* (2013.01); *H01L 2251/5338* (2013.01); *H01L 2251/556* (2013.01); *H01L 2251/566* (2013.01); *Y02E 10/549* (2013.01)

(58) Field of Classification Search
CPC .................................................... H01L 51/0097
USPC .......................................................... 257/40
See application file for complete search history.

(56) References Cited

U.S. PATENT DOCUMENTS

| | | | | |
|---|---|---|---|---|
| 2005/0256295 A1* | 11/2005 | Sakayori | ................ | C08G 73/10 528/310 |
| 2009/0047859 A1* | 2/2009 | Kim | .................. | G02F 1/133305 445/24 |
| 2011/0012845 A1* | 1/2011 | Rothkopf | ................ | G06F 3/044 345/173 |

FOREIGN PATENT DOCUMENTS

KR     10-2016-0083315 A     7/2016

* cited by examiner

*Primary Examiner* — Ajay Arora
(74) *Attorney, Agent, or Firm* — Fenwick & West LLP

(57) ABSTRACT

A display device for preventing a curling phenomenon of an edge of a substrate and solving a problem caused by separation of the substrate is disclosed. The display device includes a flexible substrate including a first substrate region overlapping a display unit and a second substrate region except the first substrate region, and a thin film transistor and an organic light emitting diode disposed on the display unit of the first substrate region. The first substrate region is formed of transparent polyimide, and the second substrate region is formed of colored polyimide.

23 Claims, 15 Drawing Sheets

DISPLAY DEVICE

This application claims the priority benefit of Korean Patent Application No. 10-2016-0184024 filed on Dec. 30, 2016, which is incorporated herein by reference for all purposes as if fully set forth herein.

BACKGROUND OF THE INVENTION

Field of the Invention

The present disclosure relates to a display device, and more particularly, to a display device for preventing a curling phenomenon of an edge of a substrate and solving a problem caused by separation of the substrate.

Discussion of the Related Art

With the development of information society, demands for display devices displaying an image are increasing in various ways. In the field of display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

In an OLED display including a flexible plastic substrate, for example, a polyimide substrate, polyimide is coated on a glass support substrate, elements such as a thin film transistor and an organic light emitting diode are manufactured on the polyimide substrate, and a chip-on film (COF) is attached to a pad portion. A process for separating the support substrate from the polyimide substrate is performed, and thus the OLED display including the flexible polyimide substrate is manufactured. The polyimide substrate is transparent enough to transmit light and has a small phase difference and a high thermal expansion coefficient. Thus, an edge of the polyimide substrate may be curled.

Further, a sacrificial layer is positioned on the support substrate and is used to separate the support substrate from the polyimide substrate. The support substrate is drawn into a deposition device and is fixed using a gripper, and then the sacrificial layer is deposited on the support substrate. However, because the sacrificial layer is not deposited in the area where the gripper is formed, it is difficult to separate the support substrate from the polyimide substrate in the area where the gripper is formed.

SUMMARY OF THE INVENTION

The present disclosure provides a display device for preventing a curling phenomenon of an edge of a substrate and solving a problem caused by separation of the substrate.

In one aspect, there is provided a display device comprising a flexible substrate including a first substrate region overlapping a display unit and a second substrate region excluding the first substrate region, and a thin film transistor and an organic light emitting diode disposed on the display unit of the first substrate region, wherein the first substrate region is formed of transparent polyimide, and the second substrate region is formed of colored polyimide.

A glass transition temperature of the transparent polyimide is equal to or lower than 350° C., and a glass transition temperature of the colored polyimide is equal to or higher than 380° C. A yellow index of the transparent polyimide is equal to or less than 5, and a yellow index of the colored polyimide is equal to or greater than 8.

In one embodiment, the display unit and the first substrate region overlap each other and have the same area. In another embodiment, an area of the first substrate region is larger than an area of the display unit.

In some embodiments, the first substrate region and the second substrate region have the same thickness.

The first substrate region and the second substrate region side-contact each other.

In some embodiments, the second substrate region entirely surrounds the first substrate region.

In some embodiments, one side of the first substrate region is further extended to the outside of the display unit than one side of the display unit by 10 μm to 1,000 μm.

In some embodiments, the second substrate region does not overlap the display unit.

In still another embodiment, a display device comprises a flexible substrate including a first substrate region and a second substrate region, the second substrate region having higher glass transition temperature and lower thermal expansion coefficient than the first substrate region; and a thin film transistor and an electroluminescent device coupled to the thin film transistor on the first substrate region of the flexible substrate. The glass transition temperature of the first substrate region may be equal to or lower than 350° C., and a glass transition temperature of the second substrate region may be equal to or higher than 380° C.

In some embodiments, the first substrate is formed of transparent polyimide, and the second substrate may be formed of colored polyimide. A yellow index of the transparent polyimide may be equal to or less than 5, and a yellow index of the colored polyimide may be equal to or greater than 8.

In some embodiments, the first substrate region and the second substrate region have the same thickness. The first substrate region and the second substrate region side-contact each other.

In some embodiments, the second substrate region entirely surrounds the first substrate region.

In some embodiments, one side of the first substrate region is further extended beyond one side of a display area of the display device on which the thin film transistor and the electroluminescent device are formed by 10 μm to 1,000 μm.

The second substrate region does not include any thin film transistor or electroluminescent device.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. It will be noted that detailed description of known arts will be omitted if it is determined that the arts can mislead the embodiments of the disclosure. Names of the respective elements used in the following explanations are selected only for convenience of writing the specification and may be thus different from those used in actual products.

A display device according to an embodiment of the disclosure is a flexible display device, in which a display element is formed on a flexible substrate. Examples of the flexible display device include an organic light emitting diode (OLED) display, a liquid crystal display (LCD), and an electrophoresis display. Embodiments of the disclosure are described using the OLED display by way of example. An OLED display includes an organic layer formed of an organic material between a first electrode serving as an anode and a second electrode serving as a cathode. The OLED display is a self-emission display device configured to form hole-electron pairs, i.e., excitons, by combining holes received from the first electrode and electrons received from the second electrode inside the organic layer and emit light by energy generated when the excitons return to a ground level.

Embodiments of the disclosure are described below with reference to FIGS. 1 to 23.

Figure 1:
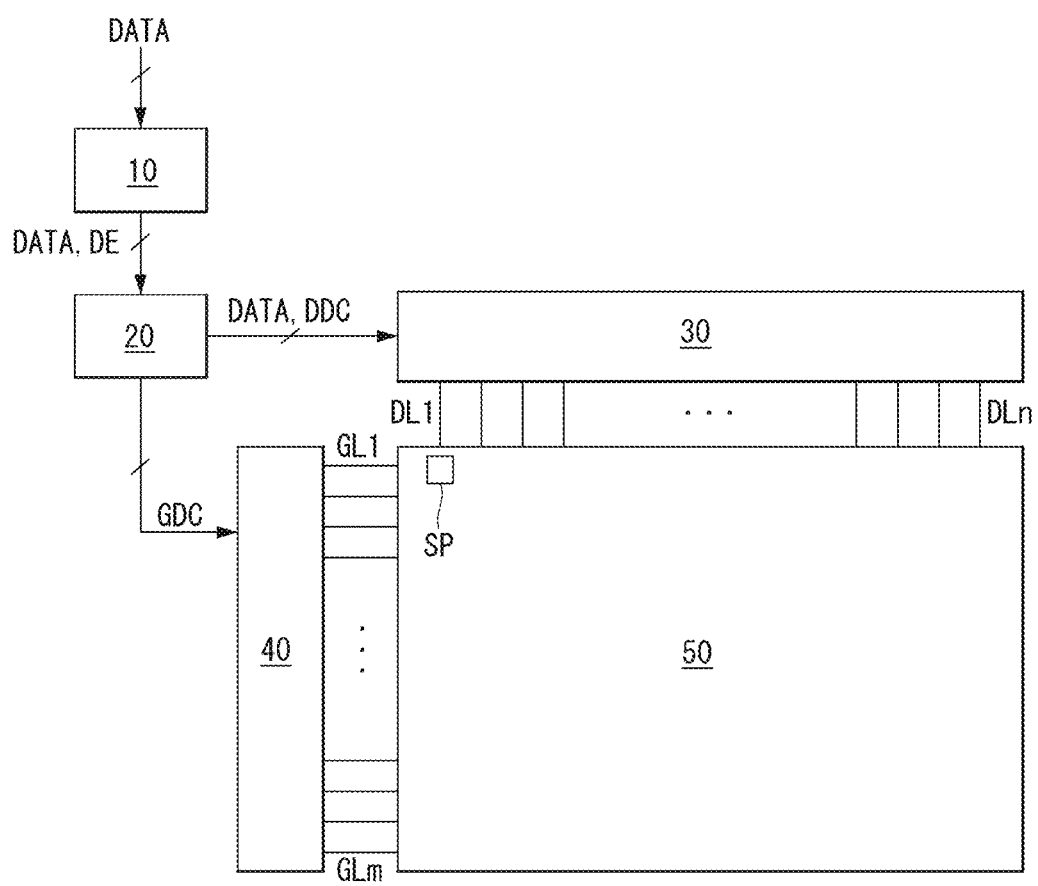
FIG. 1 is a schematic block diagram of an organic light emitting diode (OLED) display according to an embodiment of the disclosure.
Figure 2:
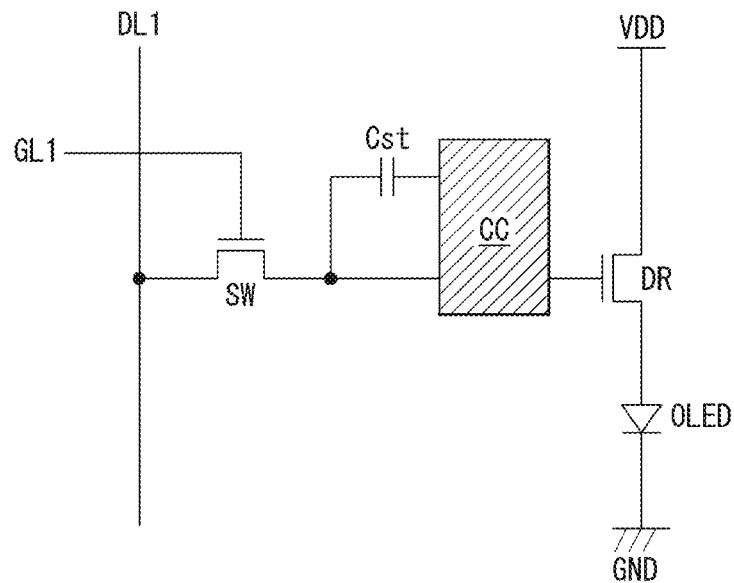
FIG. 2 illustrates a first example of a circuit configuration of a subpixel.
Figure 3:
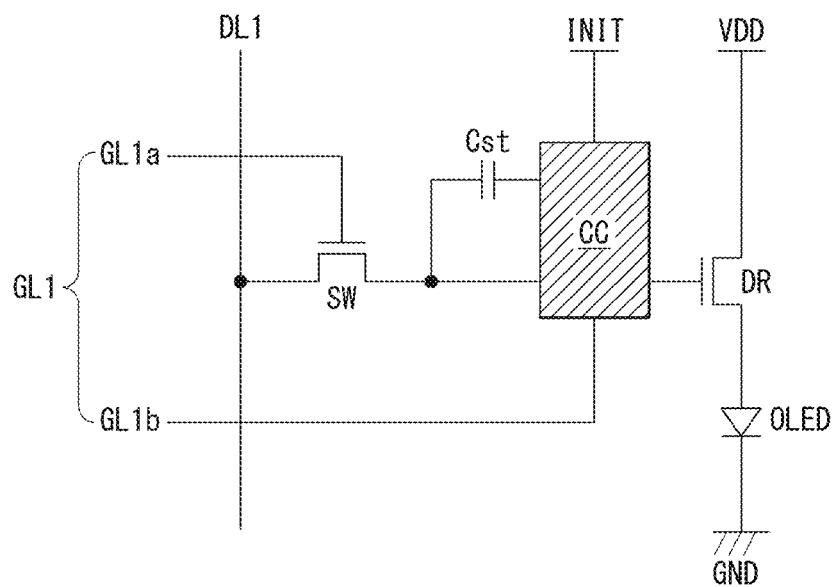
FIG. 3 illustrates a second example of a circuit configuration of a subpixel.

FIG. 1 is a schematic block diagram of an OLED display according to an embodiment of the disclosure. FIG. 2 illustrates a first example of a circuit configuration of a subpixel. FIG. 3 illustrates a second example of a circuit configuration of a subpixel.

Referring to FIG. 1, an OLED display according to an embodiment of the disclosure includes an image processing unit 10, a timing controller 20, a data driver 30, a gate driver 40, and a display panel 50.

The image processing unit 10 outputs a data signal DATA and a data enable signal DE supplied from an external system. The image processing unit 10 may output one or more of a vertical sync signal, a horizontal sync signal, and a clock signal in addition to the data enable signal DE. For convenience of explanation, these signals are not shown. The image processing unit 10 is formed on a system circuit board as an integrated circuit (IC).

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel 50 in a gate-in-panel (GIP) manner.

The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC. The compensation circuit CC includes one or more thin film transistors (TFTs) and a capacitor. Configuration of the compensation circuit CC may be variously changed depending on a compensation method. A brief description of the compensation circuit CC will be made.

As shown in FIG. 3, a subpixel including the compensation circuit CC may further include a signal line and a power line for driving a compensation TFT and supplying a predetermined signal or electric power. The gate line GL1 may include a 1-1 gate line GL1a supplying the gate signal to the switching transistor SW and a 1-2 gate line GL1b for driving the compensation TFT included in the subpixel. The added power line may be defined as an initialization power line INIT for initializing a predetermined node of the subpixel to a predetermined voltage. However, this is merely an example, and embodiments of the disclosure are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like. Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Embodiment

Figure 4:
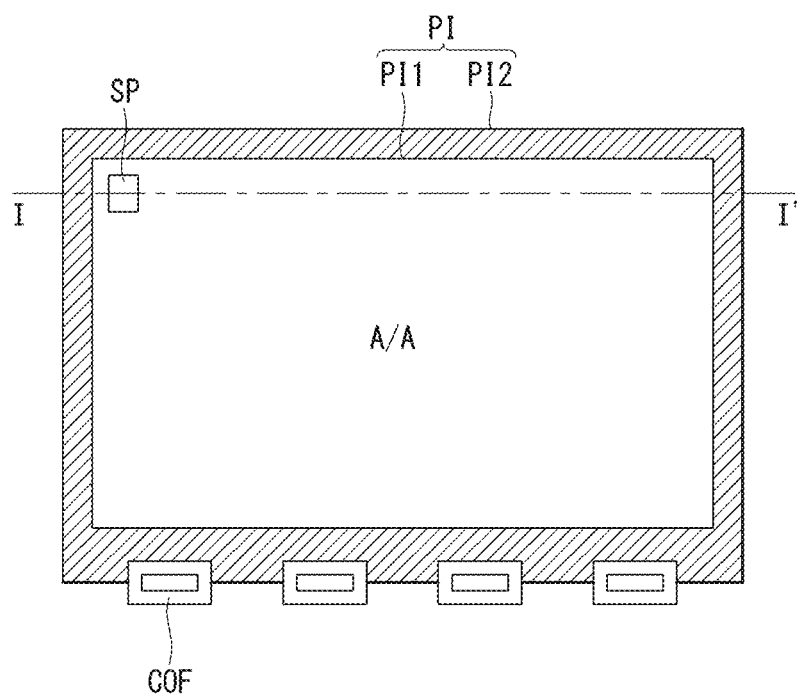
FIG. 4 is a plan view of an OLED display according to an embodiment of the disclosure.
Figure 5:
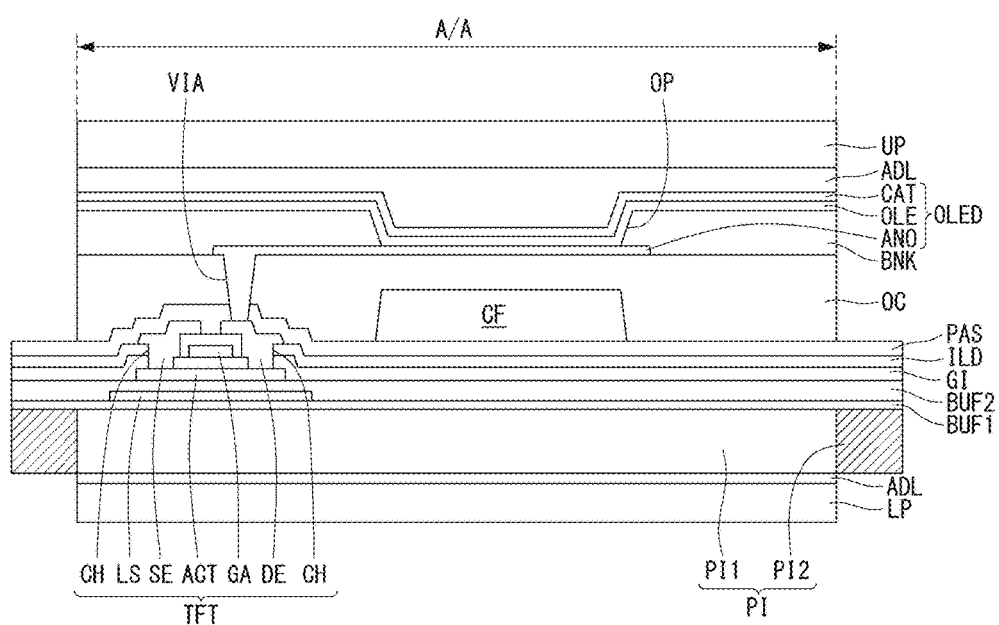
FIG. 5 is a cross-sectional view of an OLED display according to an embodiment of the disclosure.
Figure 6:
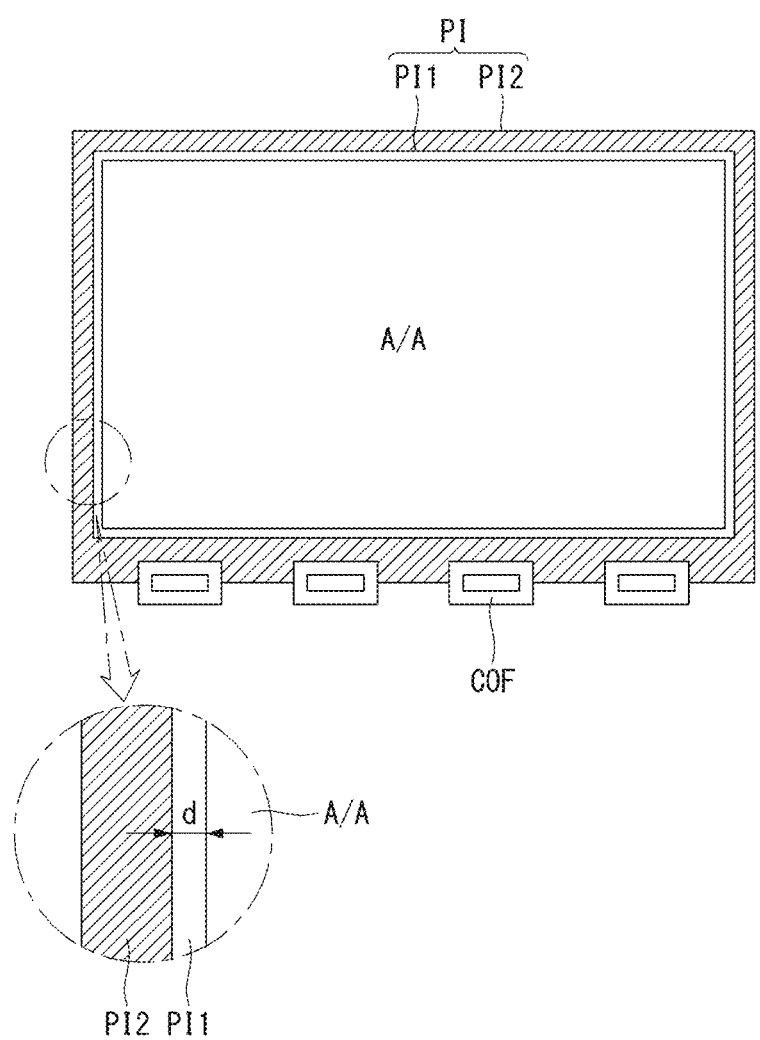
FIG. 6 is a plan view of an OLED display according to an embodiment of the disclosure.

FIG. 4 is a plan view of an OLED display according to an embodiment of the disclosure. FIG. 5 is a cross-sectional view of an OLED display according to an embodiment of the disclosure. FIG. 6 is a plan view of an OLED display according to an embodiment of the disclosure.

Referring to FIG. 4, an OLED display according to an embodiment of the disclosure includes a flexible substrate PI. The flexible substrate PI includes a first substrate region PI1 and a second substrate region PI2 surrounding the first substrate region PI1. A display unit A/A is disposed in the first substrate region PI1, and the second substrate region PI2 is disposed in a portion excluding the display unit A/A from the flexible substrate PI. Chip-on films COF are arranged on a pad portion (not shown) disposed on the lower side of the second substrate region PI2.

The first substrate region PI1 and the second substrate region PI2 are resin substrates having flexible characteristics and are made of the same material or different materials. The first substrate region PI1 may be a transparent polyimide substrate and transmits light emitted from the display unit A/A. The second substrate region PI2 may be a colored polyimide substrate, for example, a slightly yellow polyimide substrate and is disposed outside the display unit A/A. A detailed description thereof will be given later.

The display unit A/A includes a plurality of subpixels SP. For example, R (red), G (green), and B (blue) subpixels or R, B, and W (white) subpixels of the display unit A/A can emit light to represent a full color. A gate-in-panel (GIP) driver (not shown) is disposed on one side, for example, the right side of the display unit A/A and applies a gate driving signal to the display unit A/A. The chip-on films COF are attached to the pad portion (not shown) disposed on one side, for example, the lower side of the display unit A/A. A data signal and electric power are applied to a plurality of signal lines (not shown) connected to the display unit A/A through the chip-on films COF.

A cross-sectional structure of the OLED display according to the embodiment of the disclosure is described below with reference to FIG. 5. The cross-sectional structure shown in FIG. 5 includes one subpixel of the OLED display by way of example.

Referring to FIG. 5, the OLED display according to the embodiment of the disclosure includes a thin film transistor TFT and an organic light emitting diode OLED on the flexible substrate PI.

More specifically, the flexible substrate PI is a resin substrate having flexible characteristics and includes a first substrate region PI1 and a second substrate region PI2. The first substrate region PI1 and the second substrate region PI2 are made of the same material or different materials. The first substrate region PI1 may be a transparent polyimide substrate and transmits light emitted from the display unit A/A. The second substrate region PI2 may be a colored polyimide substrate, for example, a slightly yellow polyimide substrate and is disposed outside the display unit A/A.

A difference between the transparent polyimide substrate and the colored polyimide substrate is described below. The transparent polyimide substrate and the colored polyimide substrate use the same raw material, but are different in structures of some reactors depending on the use purpose and characteristics. The reactors affect an adhesive strength and spreadability, but do not affect the basic properties.

A basic mechanism for implementing the transparent polyimide substrate and the colored polyimide substrate is related to a distance between molecules constituting polyimide. For example, when it is assumed that there is a case A in which 1,000 particles of 1 μm are put into 100 mL of water and a case B in which 10 particles of 1 μm are put into 100 mL of water, the case A may indicate colored polyimide, and the case B may indicate transparent polyimide. Namely, a color difference of polyimide is generated by a difference in the number of particles (i.e., the number of molecules) between the case A and the case B. In other words, a distance between molecules in the case A including the 1,000 particles is about 100 times less than a distance between molecules in the case B including the 10 particles.

When this is applied to the polyimide substrate, it can be seen that a distance between molecules in the colored polyimide substrate is less than a distance (or referred to as "intermolecular distance") between molecules in the transparent polyimide substrate. The intermolecular distance is a factor that determines a vibration distance of the molecule at a glass transition temperature (Tg) of an organic material and a stress resulting from the vibration distance. This may indicate that the transparent polyimide substrate has a relatively larger intermolecular vibration than the colored polyimide substrate. Thus, both an increase in a stress resulting from the intermolecular vibration and an increase in a thermal expansion coefficient may be generated in the transparent polyimide substrate.

In general, a glass transition temperature Tg at which a molecular vibration occurs in the transparent polyimide substrate in use is equal to or lower than about 350° C. and is similar to a temperature at which a thin film transistor process is performed. Thus, size change and stress of the transparent polyimide substrate are caused by the molecular vibration during the thin film transistor process. In a state where the transparent polyimide substrate is attached to a glass substrate, a shape change of the transparent polyimide substrate can be supported by the glass substrate and can be suppressed. However, when the transparent polyimide substrate is separated from the glass substrate, a problem of curling occurs in the transparent polyimide substrate during the generation of an inherent stress induced by internal stress.

On the contrary, because a distance between molecules of the colored polyimide substrate is relatively shorter than the transparent polyimide substrate, a small vibration occurs between the molecules of the colored polyimide substrate. Thus, increase in stress and increase in thermal expansion coefficient in the colored polyimide substrate are relatively less than those in the transparent polyimide substrate. Further, the colored polyimide substrate has a very high glass transition temperature Tg equal to or higher than about 380° C. Thus, a temperature, at which the colored polyimide substrate is deformed by heat, is higher than a temperature of the thin film transistor process that is currently performed. As a result, the colored polyimide substrate is not deformed by heat during the thin film transistor process. Namely, the colored polyimide substrate has higher glass transition temperature and the lower thermal expansion coefficient than the transparent polyimide substrate. In addition, a yellow index of the transparent polyimide substrate is equal to or less than 5, and a yellow index of the colored polyimide substrate is equal to or greater than 8. Thus, the transparent polyimide substrate and the colored polyimide substrate can be distinguished from each other.

Accordingly, the embodiment of the disclosure can prevent the curling of the edge of the display device resulting from the stress generated when the glass substrate is separated from the polyimide substrate by disposing the colored polyimide substrate, which is not easily deformed by heat, at the edge of the display device.

A first buffer layer BUF1 is positioned on the flexible substrate PI. The first buffer layer BUF1 protects a thin film transistor formed in a subsequent process from impurities, for example, alkali ions discharged from the flexible substrate PI. The first buffer layer BUF1 may be formed of a silicon oxide (SiOx) layer, a silicon nitride (SiNx) layer, or a multilayer thereof.

A shield layer LS is positioned on the first buffer layer BUF1. The shield layer LS prevents a reduction in a panel driving current which may be generated by using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be formed of a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has high mobility (for example, more than 100 cm$^2$/Vs), low power consumption, and excellent reliability. Thus, the polycrystalline silicon can be applied to a gate driver and/or a multiplexer (MUX) for use in a driving element or applied for a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be formed of a silicon oxide (SiOx) layer, a silicon nitride (SiNx) layer, or a multilayer thereof. A gate electrode GA is positioned on the gate insulating layer GI at a location corresponding to a predetermined region (i.e., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be formed of a silicon oxide (SiOx) layer, a silicon nitride (SiNx) layer, or a multilayer thereof. Contact holes CH exposing a portion of the semiconductor layer ACT are formed at a portion where each of the interlayer dielectric layer ILD and the gate insulating layer GI is formed.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al-Nd/Mo. Thus, a thin film transistor TFT including the semiconductor layer ACT, the gate electrode GA, the source electrode SE, and the drain electrode DE is formed.

Further, a passivation layer PAS is positioned on the flexible substrate PI including the thin film transistor TFT. The passivation layer PAS is an insulating layer protecting the component underlying the passivation layer PAS and may be formed of a silicon oxide (SiOx) layer, a silicon nitride (SiNx) layer, or a multilayer thereof. A color filter CF is positioned on the passivation layer PAS. The color filter CF serves to convert white light emitted by an organic light emitting diode OLED into red, green, or blue light. An overcoat layer OC is positioned on the color filter CF. The overcoat layer OC may be a planarization layer for reducing a height difference (or step coverage) of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. The organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd) or a combination thereof. For example, the reflective layer may be formed of an Ag/Pd/Cu (APC) alloy.

In addition, a bank layer BNK defining pixels is positioned on the flexible substrate PI including the first electrode ANO. The bank layer BNK may be formed of an organic material such as polyimide, benzocyclobutene-based resin, and acrylate. The bank layer BNK includes a pixel definition portion OP exposing the first electrode ANO. An organic layer OLE contacting the first electrode ANO is positioned at a front surface of the flexible substrate PI. The organic layer OLE is a layer, in which electrons and holes combine and emit light. A hole injection layer and/or a hole transport layer may be positioned between the organic layer OLE and the first electrode ANO, and an electron injection layer and/or an electron transport layer may be positioned on the organic layer OLE.

A second electrode CAT is positioned on the organic layer OLE and may be positioned on the entire surface of the display area A/A (see FIG. 4). In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

An upper protective member UP is attached to an upper surface of the flexible substrate PI, on which the thin film transistor TFT and the organic light emitting diode OLED are formed, through an adhesive layer ADL. The upper protective member UP may be a transparent flexible substrate or a metal thin film. In embodiments disclosed herein, the upper protective member UP may be the metal thin film. A lower protective member LP is attached to a lower surface of the flexible substrate PI through an adhesive layer ADL. Because the lower protective member LP has to transmit light, the lower protective member LP may be formed of a transparent plastic film.

The first substrate region PI1 and the second substrate region PI2 of the flexible substrate PI have the same thickness, and thus there is no height difference between the first substrate region PI1 and the second substrate region PI2. The first substrate region PI1 and the second substrate region PI2 of the flexible substrate PI side-contact each other. Because the first substrate region PI1 and the second substrate region PI2 have the same core and different reactors as described above, they substantially are the same material and are attached to each other. Thus, an adhesive strength at an interface between the first substrate region PI1 and the second substrate region PI2 is very good.

In embodiments disclosed herein, the first substrate region PI1 has the same area as the display unit A/A and may be disposed corresponding to the display unit A/A. If the first substrate region PI1 is smaller than the display unit A/A, the second substrate region PI2 may be disposed at an edge of the display unit A/A. Hence, a yellow color of the second substrate region PI2 may affect an image on the display unit A/A and may reduce display quality. Thus, in embodiments disclosed herein, the first substrate region PI1 has the same area as the display unit A/A and is disposed corresponding to the display unit A/A.

On the other hand, referring to FIG. 6, one side of the first substrate region PI1 may be formed to be larger than one side of the display unit A/A by a predetermined distance d. Namely, one side of the first substrate region PI1 is further extended to the outside of the display unit A/A than one side of the display unit A/A by 10 µm to 1,000 µm. When one side of the first substrate region PI1 is further extended to the outside of the display unit A/A than one side of the display unit A/A by 10 µm or more, a patterning margin of the first substrate region PI1 can be secured. When one side of the first substrate region PI1 is further extended to the outside of the display unit A/A than one side of the display unit A/A by 1,000 µm or less, an area of the second substrate region PI2 decreases. Hence, the edge of the flexible substrate PI can be prevented from being curled.

The second substrate region PI2 is disposed to surround all the four sides of the first substrate region PI1. When the second substrate region PI2 is not disposed at any one side of the first substrate region PI1, the curling of the first substrate region PI1 may occur at the side on which the second substrate region PI2 is not disposed. Thus, in embodiment disclosed herein, it is preferable that the second substrate region PI2 is disposed to surround all the four sides of the first substrate region PI1.

As described above, the display device according to the embodiment of the disclosure disposes the first substrate region being the transparent polyimide substrate on the display unit and disposes the second substrate region being the colored polyimide substrate having a relatively low thermal expansion coefficient and a relatively high glass transition temperature so that it surrounds the display unit, thereby preventing the flexible substrate from being curled at the edge of the display device.

A method of manufacturing the display device according to the embodiment of the disclosure is described below. In the following description, structures and components identical or equivalent to those illustrated in FIGS. 4 to 6 are designated with the same reference numerals, and a further description may be briefly made or may be entirely omitted.

FIGS. 7 to 18 are cross-sectional views and plan views illustrating respective processes in a method of manufacturing a display device according to an embodiment of the disclosure.

Figure 7:
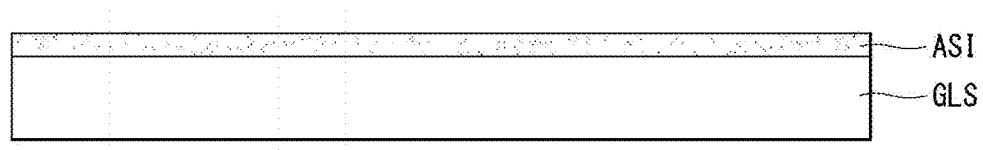
FIGS. 7 to 18 are cross-sectional views and plan views illustrating respective processes in a method of manufacturing a display device according to an embodiment of the disclosure.
Figure 8:
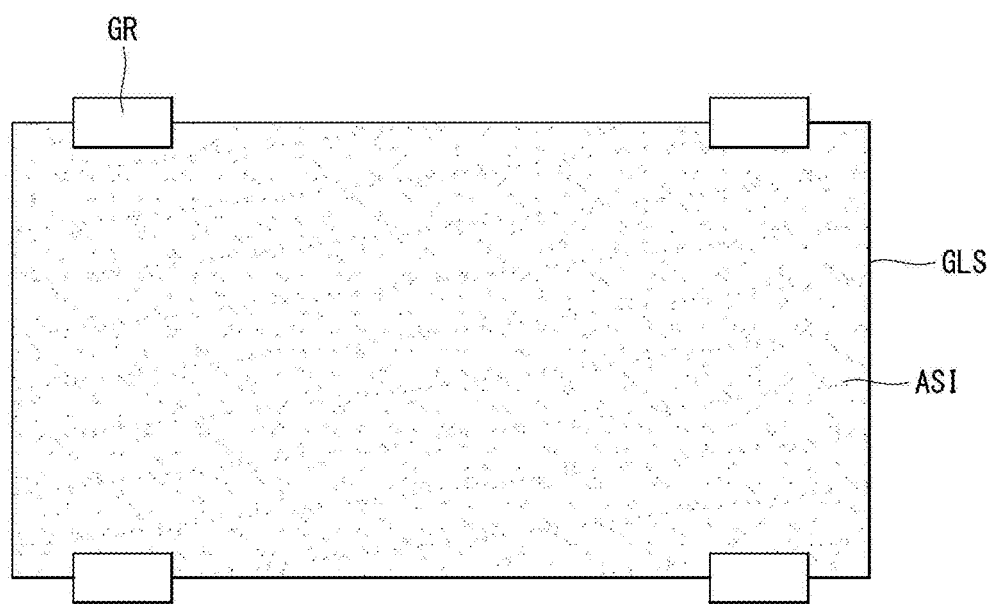

Referring to FIGS. 7 and 8, a support substrate GLS as a glass substrate is prepared. The support substrate GLS is mounted in a chamber using a gripper GR, and then a sacrificial layer ASI such as amorphous silicon is deposited on the support substrate GLS. In this instance, the sacrificial layer ASI is not deposited on a portion of the support substrate GLS covered by the gripper GR.

Figure 9:
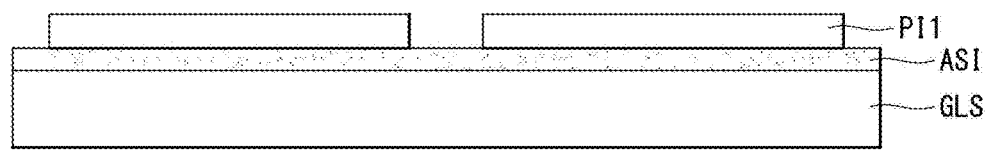
Figure 10:
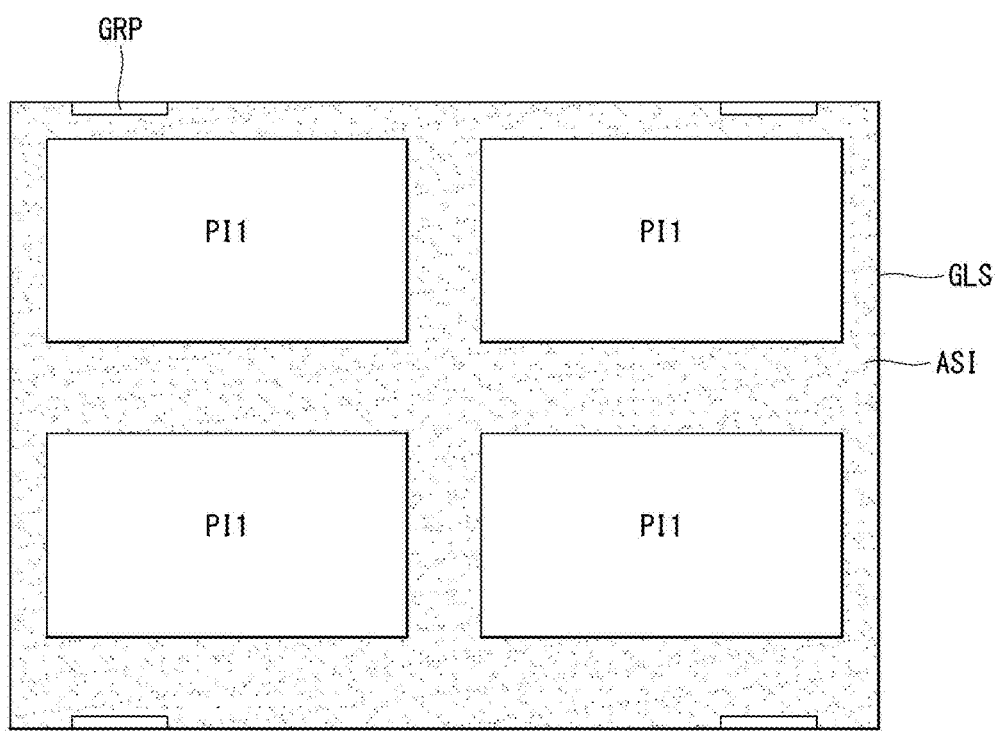

Referring to FIGS. 9 and 10, transparent polyimide is coated on the support substrate GLS, on which the sacrificial layer ASI is formed, to form a first substrate region PI1. In this instance, the first substrate region PI1 is formed only in an area where a display unit A/A that will be formed later. FIG. 10 illustrates a portion GRP which is covered by the gripper GR and on which the sacrificial layer ASI is not deposited.

Figure 11:
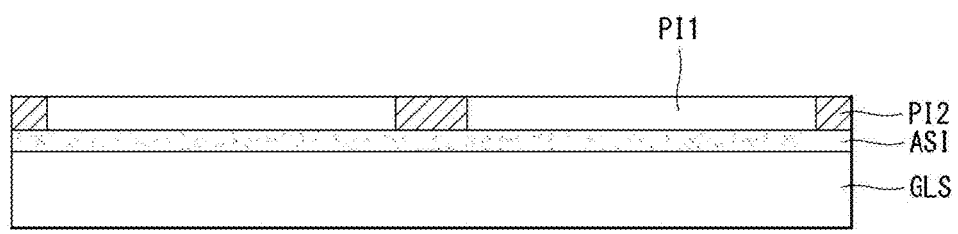
Figure 12:
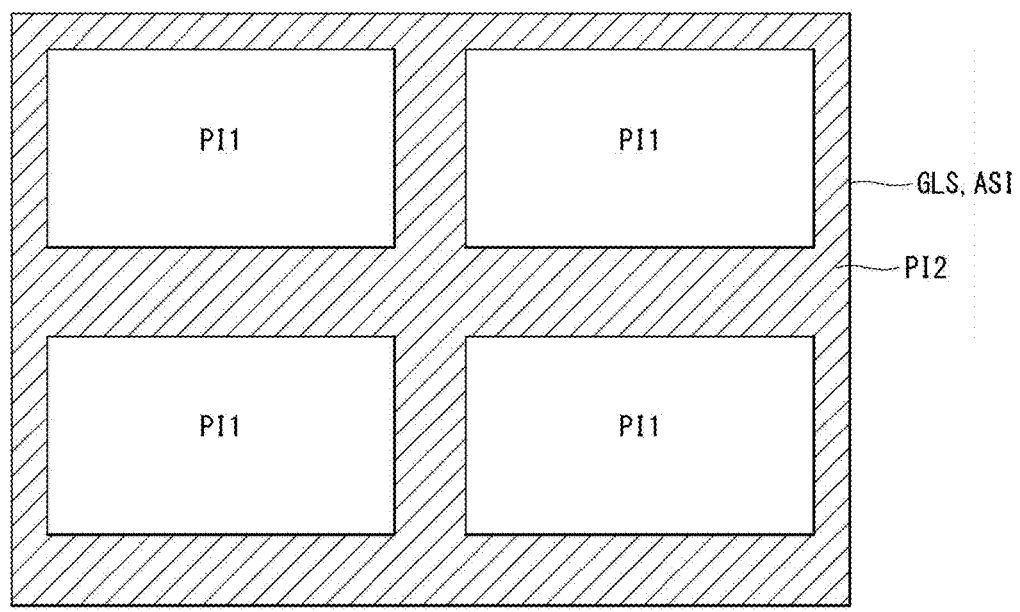

Next, referring to FIGS. 11 and 12, colored polyimide is coated on the support substrate GLS, on which the first substrate region PI1 is formed, to form a second substrate region PI2. The second substrate region PI2 is formed in areas excluding the first substrate region PI1.

Figure 13:
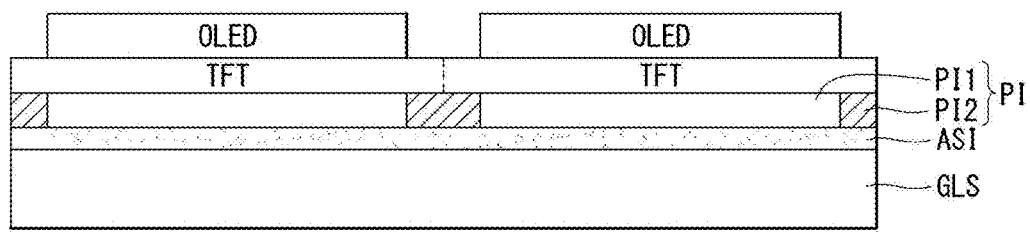
Figure 14:
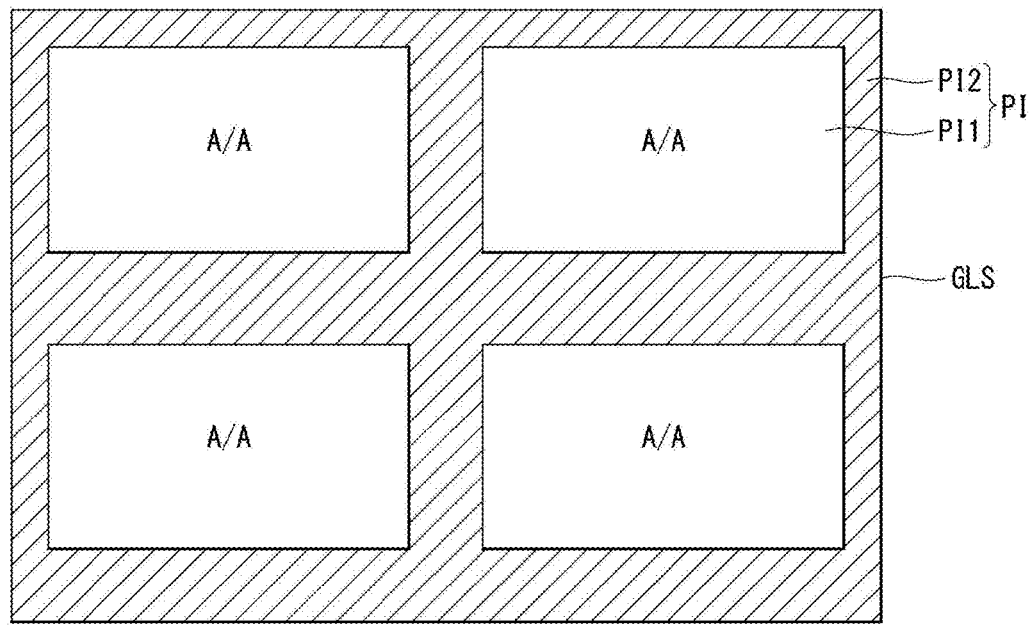

Next, referring to FIGS. 13 and 14, a thin film transistor TFT and an organic light emitting diode OLED are formed in each of display units A/A on a flexible substrate PI including the first substrate region PI1 and the second substrate region PI2. The thin film transistor TFT and the organic light emitting diode OLED are described in detail above with reference to FIG. 5, and thus a description thereof will be omitted.

Figure 15:
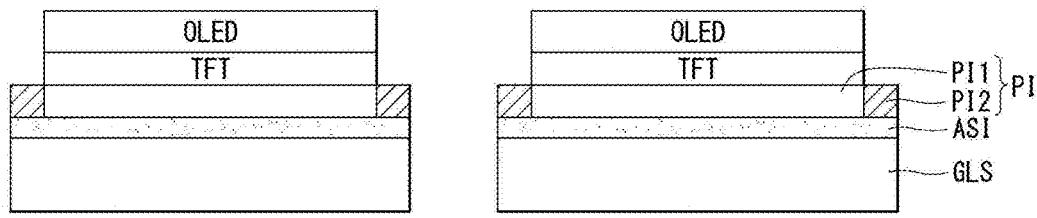
Figure 16:
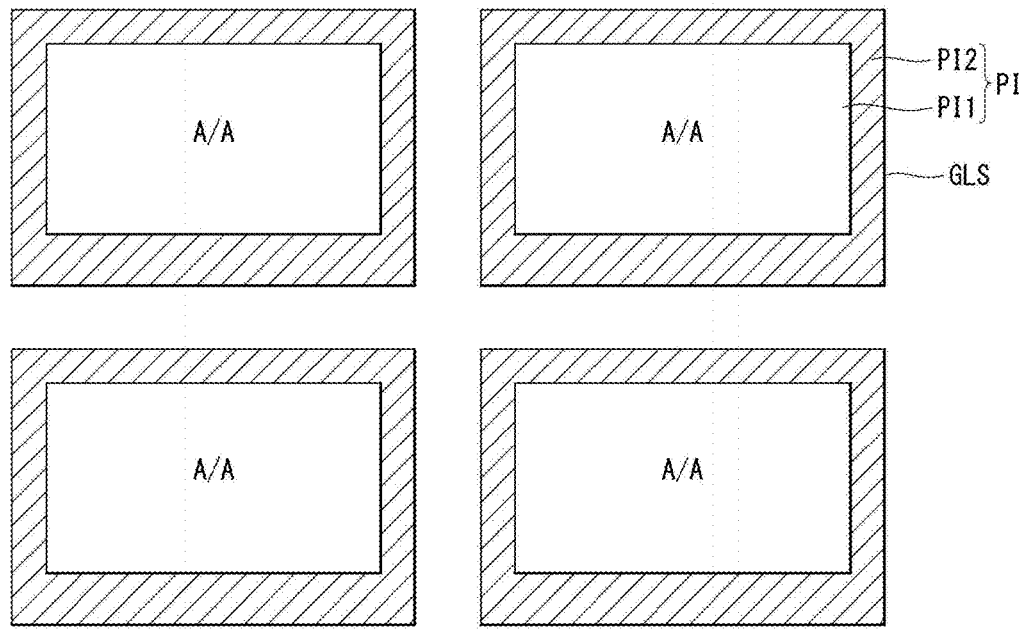

Next, referring to FIGS. 15 and 16, the support substrate GLS and the flexible substrate PI are scribed on a per cell basis. Each cell includes the first substrate region PI1 and the second substrate region PI2 surrounding the first substrate region PI1.

Figure 17:
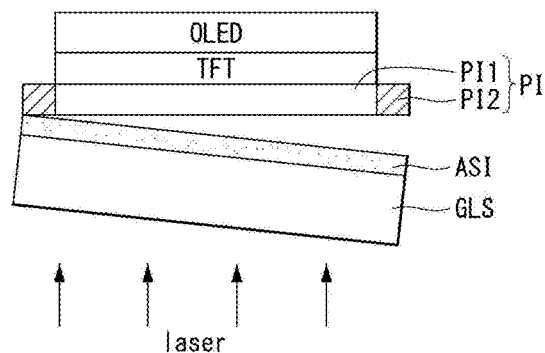

Next, referring to FIG. 17, a laser is irradiated onto the sacrificial layer ASI on the support substrate GLS to separate the support substrate GLS from the flexible substrate PI. In this instance, because the second substrate region PI2 formed of colored polyimide is disposed in a portion on which the sacrificial layer ASI is not formed due to the gripper GR, the support substrate GLS can be easily separated from the flexible substrate PI by the laser without the sacrificial layer ASI. Thus, the support substrate GLS can be easily separated from the flexible substrate PI even in a portion not having the sacrificial layer ASI, and a damage of the flexible substrate PI can be prevented.

Figure 18:
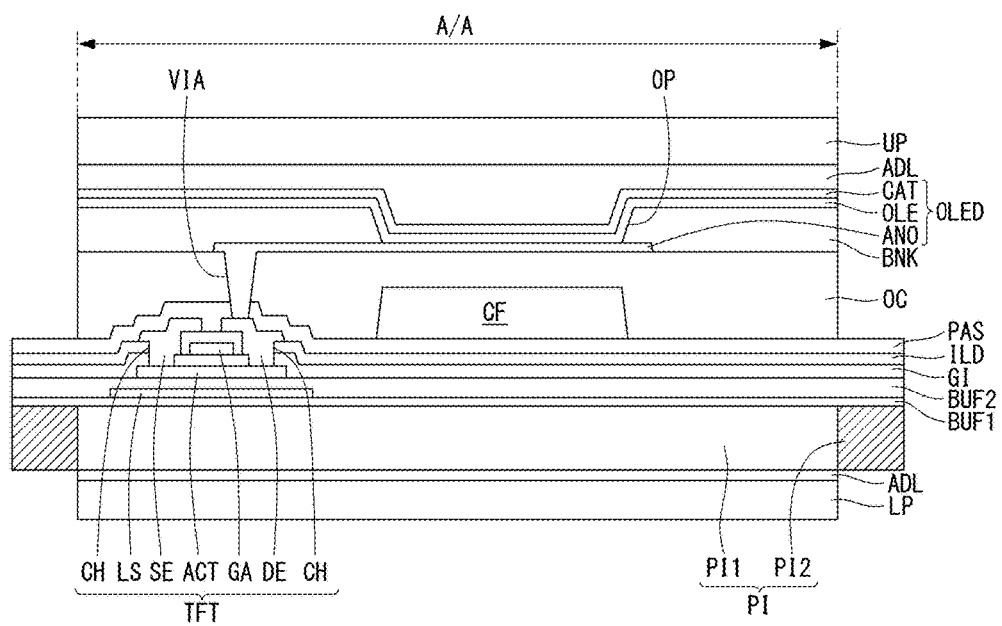

Next, referring to FIG. 18, a lower protective member LP is attached to a lower surface of the flexible substrate PI using an adhesive layer ADL, and an upper protective member UP is attached to an upper surface of the flexible substrate PI using an adhesive layer ADL. Thus, the display device according to the embodiment of the disclosure is completed.

As described above, the method of manufacturing the display device according to the embodiment of the disclosure disposes the second substrate region formed of colored polyimide having a low adhesive strength even in a portion not having the sacrificial layer, thereby easily separating the support substrate from the flexible substrate and preventing damage of the flexible substrate.

Figure 19:
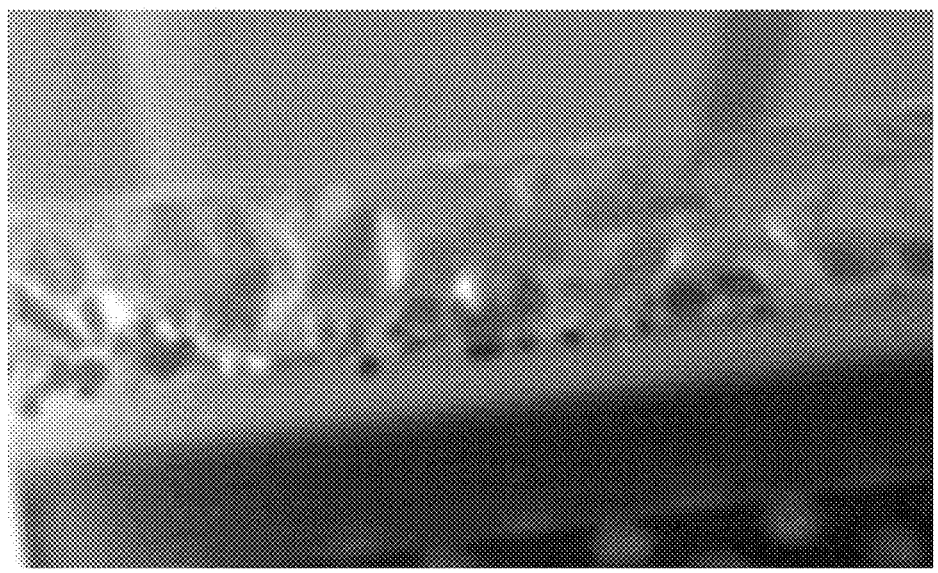
FIGS. 19 to 21 are images illustrating a separation failure between a support substrate and a flexible substrate in a display device manufactured according to a comparative example.
Figure 20:
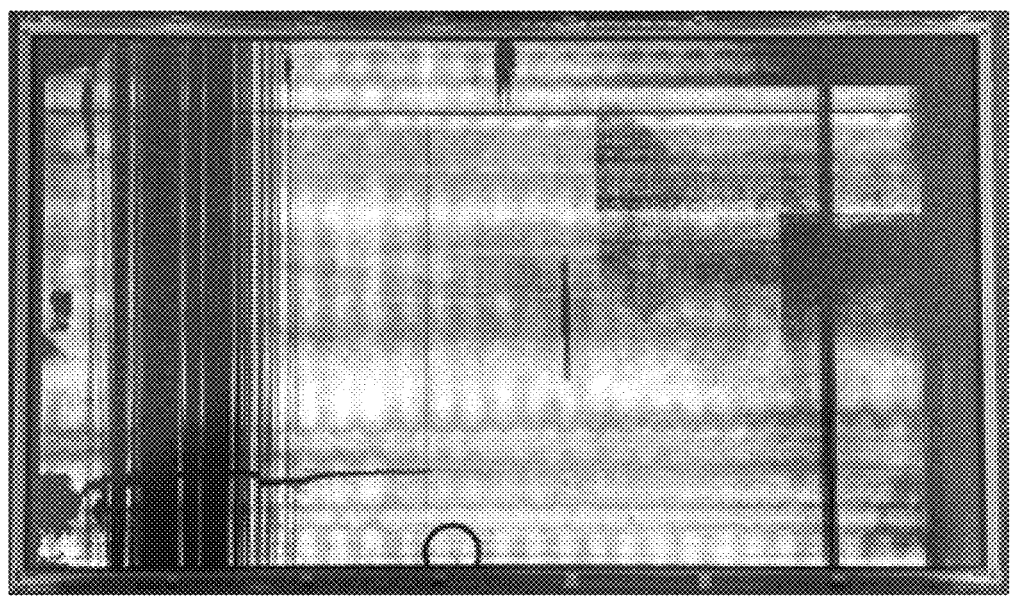
Figure 21:
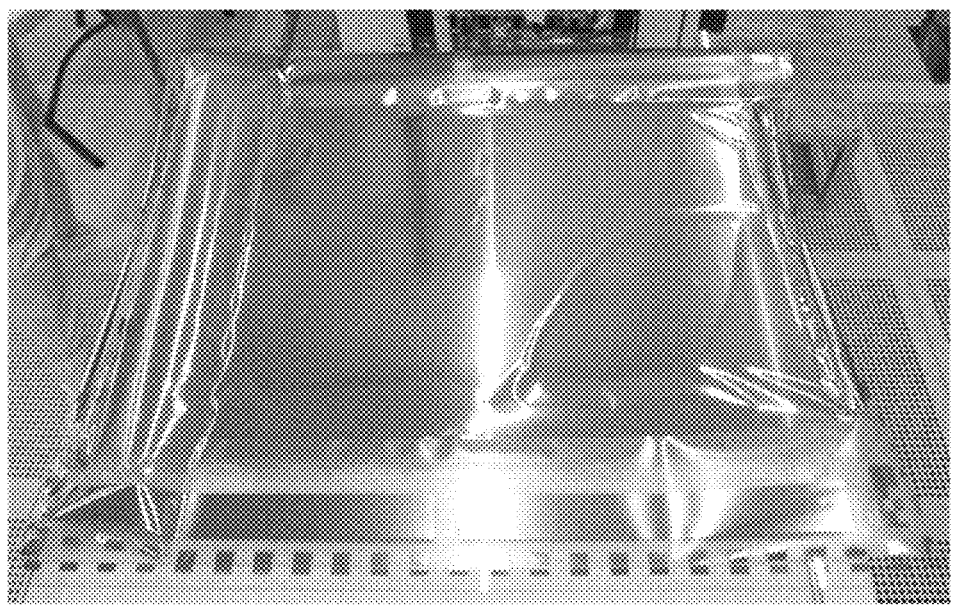
Figure 22:
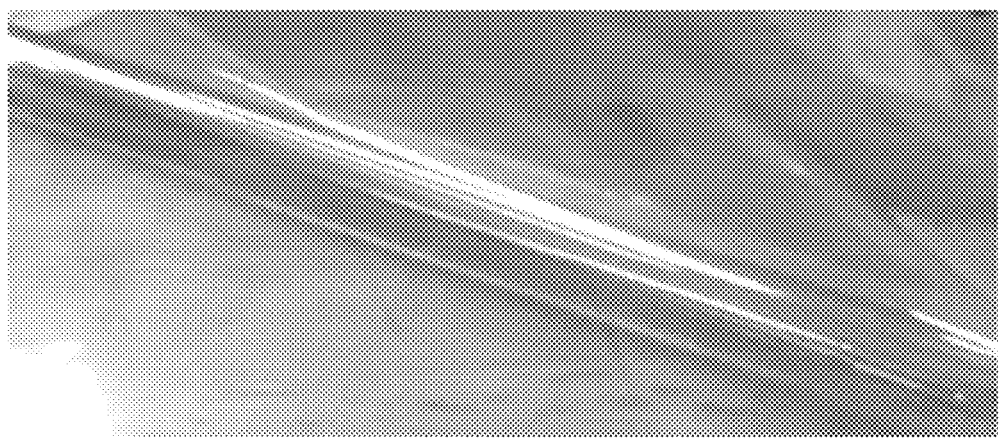
FIG. 22 is an image illustrating a curling degree of a transparent polyimide substrate.
Figure 23:
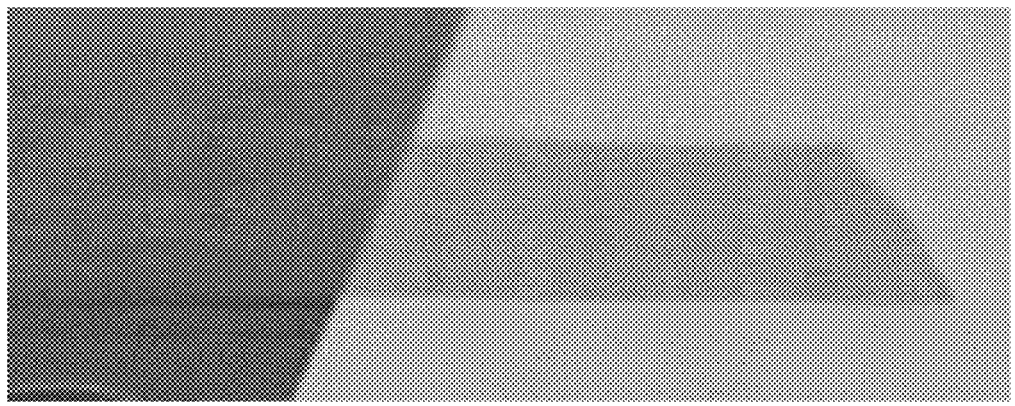
FIG. 23 is an image illustrating a curling degree of a colored polyimide substrate.

FIGS. 19 to 21 are images illustrating a separation failure between a support substrate and a flexible substrate in a display device manufactured according to a comparative example. FIG. 22 is an image illustrating a curling degree of a transparent polyimide substrate. FIG. 23 is an image illustrating a curling degree of a colored polyimide substrate.

Comparative Example

According to a comparative example, a sacrificial layer was formed on a support substrate, and transparent polyimide was entirely coated to form a flexible substrate. Thin film transistors and organic light emitting diodes were formed on the flexible substrate, and then the support substrate was separated from the flexible substrate using a laser. Thus, the display device was manufactured.

Referring to FIGS. 19 to 21, in the display device manufactured according to the comparative example, when the support substrate was separated from the flexible substrate, the support substrate was unstably separated from the flexible substrate (formed of colored polyimide) in a portion on which the sacrificial layer was not formed by a gripper. Thus, it was found that a separation failure occurred.

Referring to FIG. 22, a curling phenomenon was generated at an edge of a transparent polyimide substrate. On the other hand referring to FIG. 22, a curling phenomenon was not generated at an edge of a colored polyimide substrate.

Accordingly, the embodiments of the disclosure use transparent polyimide substrate for the display unit and use the colored polyimide substrate for the edge of the display device, thereby preventing the curling phenomenon of the edge of the display device.

As described above, the embodiments of the disclosure dispose the first substrate region formed of the transparent polyimide substrate on the display unit and dispose the second substrate region formed of the colored polyimide substrate having the higher glass transition temperature and the lower thermal expansion coefficient than the transparent polyimide substrate to surround the display unit, thereby preventing the curling phenomenon of the flexible substrate from occurring at the edge of the display device.

Furthermore, the embodiments of the disclosure dispose the second substrate region formed of colored polyimide having the low adhesive strength even in a portion not having the sacrificial layer, thereby easily separating the support substrate from the flexible substrate and preventing the damage of the flexible substrate.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a flexible substrate including a first substrate region overlapping a display unit and a second substrate region excluding the first substrate region, wherein the first substrate region includes a plurality of intersecting sides; and
   a thin film transistor and an organic light emitting diode disposed on the display unit of the first substrate region,
   wherein the first substrate region is formed of transparent polyimide, and the second substrate region is formed of colored polyimide, and
   wherein the second substrate region surrounds at least two of the plurality of intersecting sides of the first substrate region.

2. The display device of claim 1, wherein a glass transition temperature of the transparent polyimide is equal to or lower than 350° C., and a glass transition temperature of the colored polyimide is equal to or higher than 380° C.

3. The display device of claim 1, wherein a yellow index of the transparent polyimide is equal to or less than 5, and a yellow index of the colored polyimide is equal to or greater than 8.

4. The display device of claim 1, wherein the display unit and the first substrate region overlap each other and have the same area.

5. The display device of claim 1, wherein an area of the first substrate region is larger than an area of the display unit.

6. The display device of claim 1, wherein the first substrate region and the second substrate region have the same thickness.

7. The display device of claim 1, wherein the first substrate region and the second substrate region side-contact each other.

8. The display device of claim 1, wherein the second substrate region surrounds all of the plurality of intersecting sides of the first substrate region.

9. The display device of claim 1, wherein one side of the first substrate region is further extended beyond one side of the display unit by 10 µm to 1,000 µm.

10. The display device of claim 1, wherein the second substrate region does not overlap the display unit.

11. A display device comprising:
a flexible substrate including a first substrate region and a second substrate region, the second substrate region having higher glass transition temperature and lower thermal expansion coefficient than the first substrate region, wherein the first substrate region includes a plurality of intersecting sides; and
a thin film transistor and an electroluminescent device coupled to the thin film transistor on the first substrate region of the flexible substrate, and
wherein the second substrate region surrounds at least two of the plurality of intersecting sides of the first substrate region.

12. The display device of claim 11, wherein the glass transition temperature of the first substrate region is equal to or lower than 350° C., and a glass transition temperature of the second substrate region is equal to or higher than 380° C.

13. The display device of claim 11, wherein the first substrate is formed of transparent polyimide, and the second substrate is formed of colored polyimide.

14. The display device of claim 13, wherein a yellow index of the transparent polyimide is equal to or less than 5, and a yellow index of the colored polyimide is equal to or greater than 8.

15. The display device of claim 11, wherein the first substrate region and the second substrate region have the same thickness.

16. The display device of claim 11, wherein the first substrate region and the second substrate region side-contact each other.

17. The display device of claim 11, wherein the second substrate region surrounds all of the plurality of intersecting sides of the first substrate region.

18. The display device of claim 11, wherein one side of the first substrate region is further extended beyond one side of a display area of the display device on which the thin film transistor and the electroluminescent device are formed by 10 µm to 1,000 µm.

19. The display device of claim 11, wherein the second substrate region does not include any thin film transistor or electroluminescent device.

20. The display device of claim 1, wherein both the first substrate region and the second substrate region of the flexible substrate are substantially flat.

21. The display device of claim 20, wherein both the first substrate region and the second substrate region of the flexible substrate remain substantially flat after removal of the flexible substrate from another substrate.

22. The display device of claim 11, wherein the first substrate region and the second substrate region of the flexible substrate are substantially flat.

23. The display device of claim 22, wherein the both the first substrate region and the second substrate region of the flexible substrate remain substantially flat after removal of the flexible substrate from another substrate.

* * * * *